(12) United States Patent
Sun et al.

(10) Patent No.: US 11,515,508 B2
(45) Date of Patent: Nov. 29, 2022

(54) DISPLAY PANEL AND MANUFACTURING METHOD THEREOF

(71) Applicant: SHENZHEN CHINA STAR OPTOELECTRONICS SEMICONDUCTOR DISPLAY TECHNOLOGY CO., LTD., Shenzhen (CN)

(72) Inventors: Feng Sun, Shenzhen (CN); Jinchuan Li, Shenzhen (CN); Feng Wei, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 246 days.

(21) Appl. No.: 16/625,777

(22) PCT Filed: Dec. 16, 2019

(86) PCT No.: PCT/CN2019/125570
§ 371 (c)(1),
(2) Date: Dec. 23, 2019

(87) PCT Pub. No.: WO2021/109225
PCT Pub. Date: Jun. 10, 2021

(65) Prior Publication Data
US 2021/0351380 A1 Nov. 11, 2021

(30) Foreign Application Priority Data
Dec. 4, 2019 (CN) .......................... 201911224486.6

(51) Int. Cl.
*H01L 51/52* (2006.01)
*H01L 51/56* (2006.01)

(52) U.S. Cl.
CPC .......... *H01L 51/5275* (2013.01); *H01L 51/56* (2013.01)

(58) Field of Classification Search
CPC ........................ H01L 51/5275; H01L 51/5262
See application file for complete search history.

(56) References Cited

U.S. PATENT DOCUMENTS

2006/0125389 A1\* 6/2006 Song .................. H01L 51/5265
313/506
2008/0233305 A1\* 9/2008 Murata .................. H01J 9/205
427/492

(Continued)

FOREIGN PATENT DOCUMENTS

CN 101197417 A 6/2008
CN 102347452 A 2/2012

(Continued)

*Primary Examiner* — Michele Fan
(74) *Attorney, Agent, or Firm* — PV IP PC; Wei Te Chung; Ude Lu

(57) ABSTRACT

The present invention provides a display panel and a manufacturing method thereof. The display panel includes a glass substrate and a one-dimensional photonic crystal layer disposed on the glass substrate. The one-dimensional photonic crystal layer includes a plurality of crystal unit layers stacked upon each other. Each of the plurality of crystal unit layers includes a low-refractive-index sublayer disposed on a side of each of the plurality of crystal unit layers near the glass substrate and a high-refractive-index sublayer disposed on a side of each of the plurality of crystal unit layers away from the glass substrate.

14 Claims, 2 Drawing Sheets

(56) References Cited

U.S. PATENT DOCUMENTS

| | | | | |
|---|---|---|---|---|
| 2010/0182222 A1* | 7/2010 | Ichihashi | ............ | H01L 51/5275 |
| | | | | 362/311.06 |
| 2012/0018749 A1* | 1/2012 | Lee | .................... | H01L 27/3211 |
| | | | | 257/89 |
| 2021/0063607 A1* | 3/2021 | Amin | ....................... | G02B 1/14 |

FOREIGN PATENT DOCUMENTS

| | | | | | |
|---|---|---|---|---|---|
| CN | 103346267 A | * | 10/2013 | | |
| CN | 103346267 A | | 10/2013 | | |
| CN | 103730601 A | * | 4/2014 | | |
| CN | 103730601 A | | 4/2014 | | |
| CN | 104678469 A | * | 6/2015 | .............. | G02B 1/00 |
| CN | 109442772 A | | 3/2019 | | |
| JP | 2016146407 A | * | 8/2016 | | |
| WO | WO-2011034194 A1 | * | 3/2011 | ............. | B82Y 20/00 |

* cited by examiner

DISPLAY PANEL AND MANUFACTURING METHOD THEREOF

FIELD OF INVENTION

The present invention is related to the field of display panel technology, and specifically to a display panel and a manufacturing method thereof.

BACKGROUND OF INVENTION

With development of display panel technology, organic light-emitting diode (OLED) display technology has been widely used due to its advantages such as self-luminescence, wide viewing angles, low power consumption, and extremely high response speed. For an OLED display panel, its internal efficiency can basically reach 100%, but most light cannot be emitted into the air due to a poor refractive index matching of each of dielectric layers and a large light loss.

SUMMARY OF INVENTION

Currently, in a structure of an organic light-emitting diode (OLED) display panel, an interface between a glass substrate and a light-emitting functional layer (specifically, an anode ITO in the light-emitting functional layer) and an interface between the glass substrate and the outside air are prone to generate total reflection, thereby causing a large light loss in the OLED display panel. Accordingly, reducing the total reflection of the interfaces on both sides of the glass substrate becomes a problem that need solving.

The present invention provides a display panel and a manufacturing method thereof, which can solve a problem of the large light loss in the OLED display panel caused by the total reflection generated by the interface between a glass substrate and a light-emitting functional layer (specifically, an anode ITO in the light-emitting functional layer) and the interface between the glass substrate and the outside air.

The present invention provides a display panel including:
  a glass substrate;
  a one-dimensional photonic crystal layer disposed on the glass substrate and including a plurality of crystal unit layers stacked upon each other, and each of the plurality of crystal unit layers including a low-refractive-index sublayer disposed on a side of each of the plurality of crystal unit layers near the glass substrate and a high-refractive-index sublayer disposed on a side of each of the plurality of crystal unit layers away from the glass substrate; and
  a light-emitting functional layer disposed on the one-dimensional photonic crystal layer.

In the display panel of the present invention, a refractive index of the high-refractive-index sublayer is greater than or equal to 1.8, and a refractive index of the low-refractive-index sublayer is less than or equal to 1.5.

In the display panel of the present invention, a material of the high-refractive-index sublayer is selected from the group consisting of $Ta_2O_5$, $TiO_2$, $ZrO_2$, $SnO_2$, $CeO_2$, $Nb_2O_5$, $Cr_2O_3$, ZnSe, ZnS, BaS, $Gd_2O_3$, $BaTiO_3$, CaO, BN, and ZnGe.

In the display panel of the present invention, a material of the low-refractive-index sublayer is selected from the group consisting of $SiO_2$, $MgF_2$, $YF_3$, $YbF_3$, $CaF_2$, $AlF_3$, $BaF_2$, LiF, NaF, and $ThF_4$.

In the display panel of the present invention, each of the plurality of crystal unit layers further includes a transition sublayer disposed between the high-refractive-index sublayer and the low-refractive-index sublayer, a refractive index of transition sublayer is less than the refractive index of the high-refractive-index sublayer, and the refractive index of transition sublayer is greater than the refractive index of the low-refractive-index sublayer.

In the display panel of the present invention, a material of the transition sublayer is selected from the group consisting of SiO, $Y_2O_3$, $Al_2O_3$, MgO, $HfO_2$, ITO, and $PbF_2$.

In the display panel of the present invention, thicknesses of the high-refractive-index sublayer, the low-refractive-index sublayer, and the transition sublayer are given by a formula:

$$D_m = \lambda/(4 \times n_m), m \in (1,2,3)$$

where,
  $\lambda$ is a central wavelength of light wave emitted by the light-emitting functional layer;
  $D_1$ is the thickness of the high-refractive-index sublayer, $n_1$ is the refractive index of the high-refractive-index sublayer;
  $D_2$ is the thickness of the low-refractive-index sublayer, $n_2$ is the refractive index of the low-refractive-index sublayer; and
  $D_3$ is the thickness of the transition sublayer, $n_3$ is the refractive index of the transition sublayer.

In the display panel of the present invention, the plurality of crystal unit layers includes ten crystal unit layers.

In the display panel of the present invention, the light-emitting functional layer includes an anode layer disposed on the one-dimensional photonic crystal layer, an organic layer disposed on the anode layer, and a cathode layer disposed on the organic layer.

According to the above purpose, the present invention further provides a manufacturing method of a display panel, including the steps of:
  providing a glass substrate;
  forming a one-dimensional photonic crystal layer on the glass substrate, wherein the one-dimensional photonic crystal layer includes a plurality of stacked crystal unit layers, and each of the plurality of crystal unit layers includes a low-refractive-index sublayer formed on a side of each of the plurality of crystal unit layers near the glass substrate and a high-refractive-index sublayer formed on a side of each of the plurality of crystal unit layers away from the glass substrate; and
  forming a light-emitting functional layer on the one-dimensional photonic crystal layer.

In the manufacturing method of the display panel of the present invention, forming a light-emitting functional layer on the one-dimensional photonic crystal layer includes the steps of:
  forming an anode layer on the one-dimensional photonic crystal layer;
  forming an organic layer on the anode layer; and
  forming a cathode layer on the organic layer.

In the manufacturing method of the display panel of the present invention, the organic layer and the cathode layer are formed by evaporation.

In the manufacturing method of the display panel of the present invention, the low-refractive-index sublayer and the high-refractive-index sublayer are formed by evaporation.

In the manufacturing method of the display panel of the present invention, a material of the low-refractive-index sublayer is selected from the group consisting of $SiO_2$, $MgF_2$, $YF_3$, $YbF_3$, $CaF_2$, $AlF_3$, $BaF_2$, LiF, NaF, and $ThF_4$.

In the manufacturing method of the display panel of the present invention, a material of the high-refractive-index sublayer is selected from the group consisting of $Ta_2O_5$, $TiO_2$, $ZrO_2$, $SnO_2$, $CeO_2$, $Nb_2O_5$, $Cr_2O_3$, ZnSe, ZnS, BaS, $Gd_2O_3$, $BaTiO_3$, CaO, BN, and ZnGe.

The present invention disposes a one-dimensional photonic crystal layer between the glass substrate and the light-emitting functional layer, and uses the optical waveguide coupling effect of the one-dimensional photonic crystal layer to adjust light propagation, thereby reducing the light loss of the display panel due to total reflection and improving light extraction efficiency of the display panel. In addition, a production of the one-dimensional photonic crystal layer is simple, does not affect productions of other structures in the display panel, and is also suitable for a large-scale production, which has a better application effect in large-area displays.

DESCRIPTION OF DRAWINGS

The following describes specific embodiments of the present invention in detail with reference to the accompanying drawings, which will make technical solutions and other beneficial effects of the present invention obvious.

DETAILED DESCRIPTION OF PREFERRED EMBODIMENTS

Figure 1:
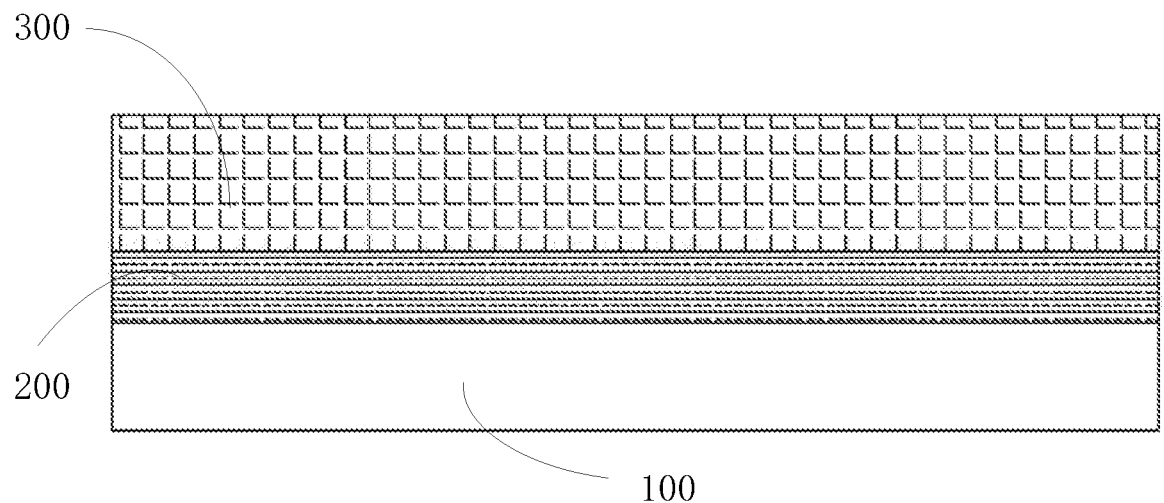
FIG. 1 is a structural diagram of a display panel according to an embodiment of the present invention.

Embodiments of the present invention are described detailly below. Examples of the embodiments are shown in the drawings, and units of the same or similar functions are using the same or similar numeral to represent. Embodiments reference to the appended drawings are used to describe and understand the present invention, not to limit the present invention.

Examples are described below with reference to the appended drawings, and the drawings illustrate particular embodiments in which the present invention may be practiced. Directional terms mentioned in the present invention, such as center, transverse, upper, lower, left, right, vertical, horizontal, top, bottom, in, out, etc., only refer to directions in the accompanying drawings. Thus, the adoption of directional terms is used to describe and understand the present invention, but not to limit the present invention. In addition, the terms first and second are merely used for illustrative purposes only, but are not to be construed as indicating or imposing a relative importance or implicitly indicating the number of technical features indicated. Thus, a feature that defines "first" or "second" may expressly or implicitly include one or more of the features. In the description of the present invention, the meaning of plural is two or more, unless otherwise specified. In addition, the terms "including" and any variations thereof are intended to cover a non-exclusive inclusion.

The terminology used herein is for the purpose of describing particular embodiments only and is not intended to limit the exemplary embodiments. Unless the context clearly dictates otherwise, the singular forms "a" and "an", as used herein, are also intended to include the plural. It should also be understood that the terms "include" and/or "include" both mean a presence of characteristics, integers, steps, operations, units and/or components stated in the specification, and do not exclude the presence or addition of one or more other features, integers, operations, units, components and/or combinations thereof.

The present invention is further described below with reference to the drawings and embodiments.

Figure 2:
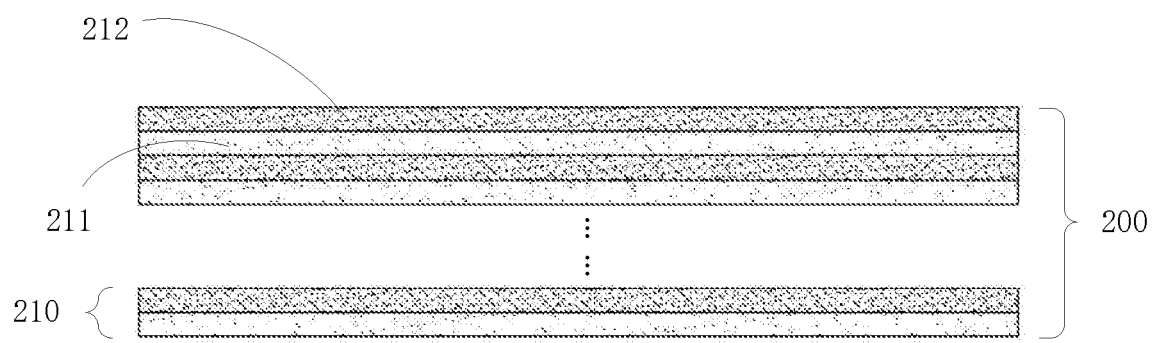
FIG. 2 is a structural diagram of a one-dimensional photonic crystal layer in the display panel according to the embodiment of the present invention.

As shown in FIGS. 1 and 2, the present invention provides a display panel, and specifically an organic light-emitting diode (OLED) display panel with a bottom emission structure, including:

a glass substrate 100;

a one-dimensional photonic crystal layer 200 disposed on the glass substrate 100 and including a plurality of crystal unit layers 210 stacked upon each other, and each of the plurality of crystal unit layers 210 including a low-refractive-index sublayer 211 disposed on a side of each of the plurality of crystal unit layers 210 near the glass substrate 100 and a high-refractive-index sublayer 212 disposed on a side of each of the plurality of crystal unit layers 210 away from the glass substrate 100; and a light-emitting functional layer 300 disposed on the one-dimensional photonic crystal layer 200.

Understandably, the light-emitting functional layer 300 includes an anode layer disposed on the one-dimensional photonic crystal layer 200, an organic layer disposed on the anode layer, and a cathode layer disposed on the organic layer. Specifically, the organic layer sequentially includes hole injection layer (HIL), hole transport layer (HTL), emitting layer (EML), electron transport layer (ETL), electron injection layer (EIL). The anode layer can be disposed on the one-dimensional photonic crystal layer 200 by stacking ITO/Ag/ITO. The one-dimensional photonic crystal layer 200 is a one-dimensional photonic crystal (1D PC). By introducing the one-dimensional photonic crystal between the anode layer and the glass substrate 100, photons in the waveguide effect of the display-related functional layer are released, absorption of light is reduced, and the light loss of the display panel due to total reflection is reduced, which improves light extraction efficiency of the display panel.

In an embodiment, a refractive index of the high-refractive-index sublayer 212 is greater than or equal to 1.8, and a refractive index of the low-refractive-index sublayer 211 is less than or equal to 1.5. Specifically, a material of the high-refractive-index sublayer 212 is selected from the group consisting of $Ta_2O_5$, $TiO_2$, $ZrO_2$, $SnO_2$, $CeO_2$, $Nb_2O_5$, $Cr_2O_3$, ZnSe, ZnS, BaS, $Gd_2O_3$, $BaTiO_3$, CaO, BN, and ZnGe. A material of the low-refractive-index sublayer 211 is selected from the group consisting of $SiO_2$, $MgF_2$, $YF_3$, $YbF_3$, $CaF_2$, $AlF_3$, $BaF_2$, LiF, NaF, and $ThF_4$.

In an embodiment, the plurality of crystal unit layers 210 includes ten crystal unit layers. Obviously, if the plurality of crystal unit layers 210 are stacked too many layers, an overall thickness of the display panel becomes high, which affects lightness and thinness of the display panel. If the plurality of crystal unit layers 210 are stacked too few layers, the light extraction efficiency is affected.

Figure 3:
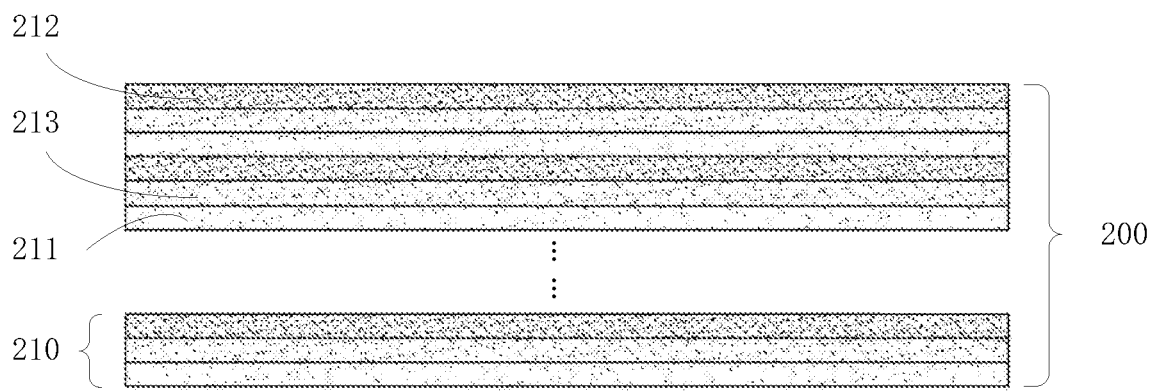
FIG. 3 is a structural diagram of another one-dimensional photonic crystal layer in the display panel according to an embodiment of the present invention.

In an embodiment, as shown in FIG. 3 each of the plurality of crystal unit layers 210 further includes a transition sublayer 213 disposed between the high-refractive-index sublayer 212 and the low-refractive-index sublayer 211. A refractive index of transition sublayer 213 is less than the refractive index of the high-refractive-index sublayer 212, and the refractive index of transition sublayer 213 is greater than the refractive index of the low-refractive-index sublayer 211. Understandably, the refractive index of transition sublayer 213 is between 1.5 and 1.8. Specifically, a material of the transition sublayer is selected from the group consisting of SiO, $Y_2O_3$, $Al_2O_3$, MgO, $HfO_2$, ITO, and $PbF_2$.

It is worth noting that a multilayer structure can be disposed between the high-refractive-index sublayer 212 and the low-refractive-index sublayer 211. Specifically, in a direction from the high-refractive-index sublayer 212 to the low-refractive-index sublayer 211, the refractive index gradually decreases.

In an embodiment, thicknesses of the high-refractive-index sublayer, the low-refractive-index sublayer, and the transition sublayer are given by a formula:

$$D_m = \lambda/(4 \times n_m), m \in (1,2,3)$$

where, $\lambda$ is a central wavelength of light wave emitted by the light-emitting functional layer;

$D_1$ is the thickness of the high-refractive-index sublayer, $n_1$ is the refractive index of the high-refractive-index sublayer;

$D_2$ is the thickness of the low-refractive-index sublayer, $n_2$ is the refractive index of the low-refractive-index sublayer; and $D_3$ is the thickness of the transition sublayer, $n_3$ is the refractive index of the transition sublayer.

Understandably, in a specific display panel, the central wavelength of the light wave is stable. From the above formula, it can be known that the greater the refractive index, the less the layer thickness.

Figure 4:
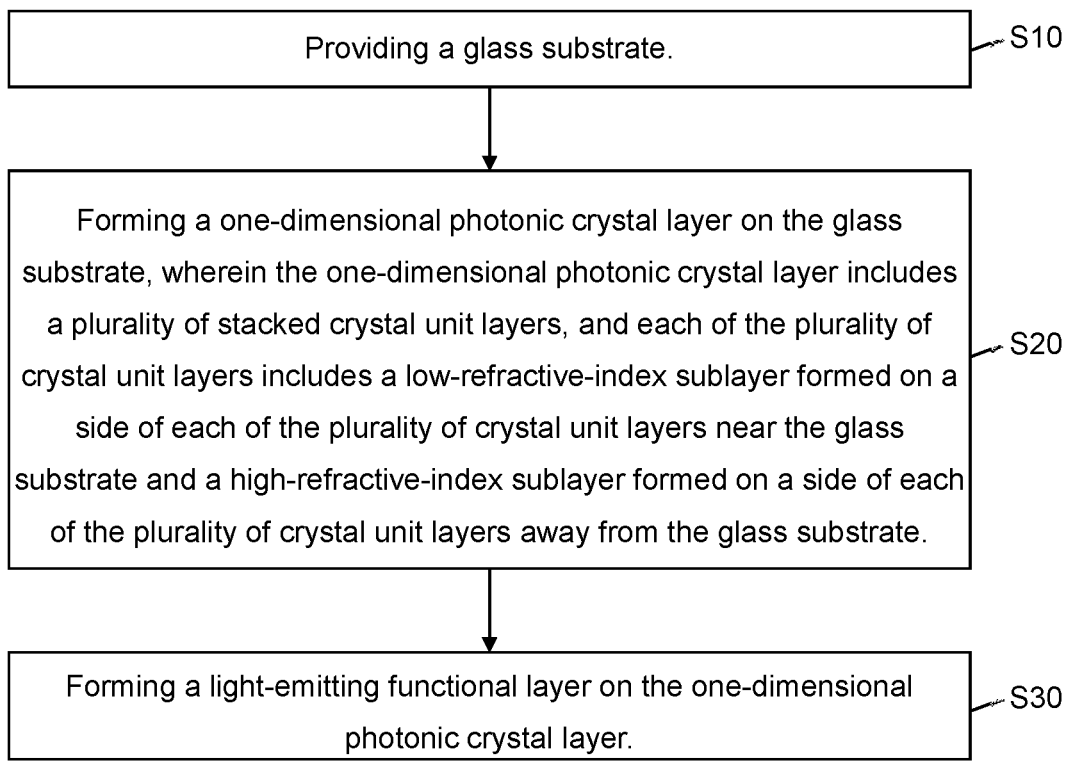
FIG. 4 is a flowchart of a manufacturing method of the display panel according to embodiments of the present invention.

The present invention further provides a manufacturing method of a display panel, as shown in FIG. 4, including the steps of:

step S10: providing a glass substrate 100;

step S20: forming a one-dimensional photonic crystal layer 200 on the glass substrate 100, wherein the one-dimensional photonic crystal layer 200 includes a plurality of stacked crystal unit layers 210, and each of the plurality of crystal unit layers 210 includes a low-refractive-index sublayer 211 formed on a side of each of the plurality of crystal unit layers 210 near the glass substrate 100 and a high-refractive-index sublayer 212 formed on a side of each of the plurality of crystal unit layers 210 away from the glass substrate 100; and step S30: forming a light-emitting functional layer 300 on the one-dimensional photonic crystal layer 200.

In an embodiment, the step S20: forming a one-dimensional photonic crystal layer 200 on the glass substrate 100, wherein the one-dimensional photonic crystal layer 200 includes a plurality of stacked crystal unit layers 210 specifically includes the steps of:

step S21: forming the low-refractive-index sublayer 211; and step S23: forming a high-refractive-index sublayer 212 on the low-refractive-index sublayer 211 to obtain each of the plurality of crystal unit layers 210.

In addition, step S21 and step S23 are repeated on a previous crystal unit layer 210 in order to form a next crystal unit layer 210 until required layers of the crystal unit layers 210 are reached, and the one-dimensional photonic crystal layer 200 will be formed. Obviously, during a formation of a first crystal unit layer 210, the low-refractive-index sublayer 211 is formed on the glass substrate 100.

In an embodiment, the low-refractive-index sublayer 211, the refractive index of transition sublayer 213, and the high-refractive-index sublayer 212 are formed by evaporation. The steps of forming the light-emitting functional layer 300 in the step S30 includes:

forming an anode layer on the one-dimensional photonic crystal layer 200;

forming an organic layer on the anode layer; and forming a cathode layer on the organic layer.

The organic layer and the cathode layer are formed by evaporation.

It is worth noting that the one-dimensional photonic crystal 200 disposed between the anode layer and the glass substrate 100 in the display panel of the present invention is relatively simple compared to the two-dimensional photonic crystal structure and manufacturing processes thereof. A production of two-dimensional photonic crystals has high requirements on a grating period, a grating depth, and a duty cycle. The structure of the one-dimensional photonic crystal is relatively simple, and it only needs to be produced through multiple layers without additional patterning or other steps. In a specific manufacturing process, only one process (such as evaporation) is used to produce, without the need to transfer and replace equipment, so that the process is simple, and it is very suitable for batch production.

In summary, the present invention disposes a one-dimensional photonic crystal layer 200 between the glass substrate 100 and the light-emitting functional layer 300 and uses the optical waveguide coupling effect of the one-dimensional photonic crystal layer 200 to adjust light propagation, and the light loss of the display panel due to total reflection is reduced, which improves light extraction efficiency of the display panel. In addition, a production of the one-dimensional photonic crystal layer 200 is simple, does not affect productions of other structures in the display panel, and is also suitable for a large-scale production, which has a better application effect in large-area displays.

Understandably, those having ordinary skills of the art may easily contemplate various changes and modifications of the technical solution and technical ideas of the present invention and all these changes and modifications are considered within the protection scope of right for the present invention.

What is claimed is:

1. A display panel, comprising:
   a glass substrate;
   a one-dimensional photonic crystal layer disposed on the glass substrate and comprising a plurality of crystal unit layers stacked upon each other, wherein each of the plurality of crystal unit layers comprises a low-refractive-index sublayer disposed on one side near the glass substrate, a high-refractive-index sublayer disposed on one side away from the glass substrate, and a transition sublayer disposed between the high-refractive-index sublayer and the low-refractive-index sublayer, wherein a refractive index of the transition sublayer is less than the refractive index of the high-refractive-index sublayer, and the refractive index of the transition sublayer is greater than the refractive index of the low-refractive-index sublayer; and
   a light-emitting functional layer disposed on the one-dimensional photonic crystal layer;
   wherein in each of the crystal unit layer, the refractive indices of the high-refractive-index sublayer, the transition sublayer, and the low-reflective-index sublayer decrease in a direction toward the glass substrate and away from the light-emitting functional layer.

2. The display panel as claimed in claim 1, wherein a refractive index of the high-refractive-index sublayer is greater than or equal to 1.8, and a refractive index of the low-refractive-index sublayer is less than or equal to 1.5.

3. The display panel as claimed in claim 2, wherein a material of the high-refractive-index sublayer is selected from the group consisting of $Ta_2CO_5$, $TiO_2$, $ZrO_2$, $SnO_2$, $CeO_2$, $Nb_2O_5$, $Cr_2O_3$, ZnSe, ZnS, BaS, $Gd_2O_3$, $BaTiO_3$, CaO, BN, and ZnGe.

4. The display panel as claimed in claim 2, wherein a material of the low-refractive-index sublayer is selected from the group consisting of $SiO_2$, $MgF_2$, $YF_3$, $YbF_3$, $CaF_2$, $AlF_3$, $BaF_2$, LiF, NaF, and $ThF_4$.

5. The display panel as claimed in claim 1, wherein a material of the transition sublayer is selected from the group consisting of SiO, $Y_2O_3$, $Al_2O_3$, MgO, $HfO_2$, ITO, and $PbF_2$.

6. The display panel as claimed in claim 1, wherein thicknesses of the high-refractive-index sublayer, the low-refractive-index sublayer, and the transition sublayer are given by a formula:

$$D_m = \lambda/(4 \times n_m), m \in (1,2,3)$$

where, $\lambda$ is a central wavelength of light wave emitted by the light-emitting functional layer;

$D_1$ is the thickness of the high-refractive-index sublayer, $n_1$ is the refractive index of the high-refractive-index sublayer;

$D_2$ is the thickness of the low-refractive-index sublayer, $n_2$ is the refractive index of the low-refractive-index sublayer; and $D_3$ is the thickness of the transition sublayer, $n_3$ is the refractive index of the transition sublayer.

7. The display panel as claimed in claim 1, wherein the plurality of crystal unit layers comprises ten crystal unit layers.

8. The display panel as claimed in claim 1, wherein the light-emitting functional layer comprises an anode layer disposed on the one-dimensional photonic crystal layer, an organic layer disposed on the anode layer, and a cathode layer disposed on the organic layer.

9. A manufacturing method of a display panel, comprising steps as follows:

providing a glass substrate;

forming a one-dimensional photonic crystal layer on the glass substrate, wherein the one-dimensional photonic crystal layer comprises a plurality of stacked crystal unit layers, and each of the plurality of crystal unit layers comprises a low-refractive-index sublayer formed on one side near the glass substrate, a high-refractive-index sublayer formed on one side away from the glass substrate, and a transition sublayer arranged between the high-refractive-index sublayer and the low-refractive-index sublayer, wherein a refractive index of the transition sublayer is less than the refractive index of the high-refractive-index sublayer, and the refractive index of the transition sublayer is greater than the refractive index of the low-refractive-index sublayer; and forming a light-emitting functional layer on the one-dimensional photonic crystal layer, wherein in each of the crystal unit layer, the refractive indices of the high-refractive-index sublayer, the transition sublayer, and the low-reflective-index sublayer decrease in a direction toward the glass substrate and away from the light-emitting functional layer.

10. The manufacturing method of the display panel as claimed in claim 9, wherein forming a light-emitting functional layer on the one-dimensional photonic crystal layer comprises the steps of:

forming an anode layer on the one-dimensional photonic crystal layer;

forming an organic layer on the anode layer; and forming a cathode layer on the organic layer.

11. The manufacturing method of the display panel as claimed in claim 10, wherein the organic layer and the cathode layer are formed by evaporation.

12. The manufacturing method of the display panel as claimed in claim 9, wherein the low-refractive-index sublayer and the high-refractive-index sublayer are formed by evaporation.

13. The manufacturing method of the display panel as claimed in claim 9, wherein a material of the low-refractive-index sublayer is selected from the group consisting of $SiO_2$, $MgF_2$, $YF_3$, $YbF_3$, $CaF_2$, $AlF_3$, $BaF_2$, LiF, NaF, and $ThF_4$.

14. The manufacturing method of the display panel as claimed in claim 9, wherein a material of the high-refractive-index sublayer is selected from the group consisting of $Ta_2O_5$, $TiO_2$, $ZrO_2$, $SnO_2$, $CeO_2$, $Nb_2O_5$, $Cr_2O_3$, ZnSe, ZnS, BaS, $Gd_2O_3$, $BaTiO_3$, CaO, BN, and ZnGe.

* * * * *